United States Patent
Lee et al.

(10) Patent No.: US 8,536,560 B2
(45) Date of Patent: Sep. 17, 2013

(54) SEMICONDUCTOR MEMORY DEVICE WITH THREE DIMENSIONAL SOLID ELECTROLYTE STRUCTURE, AND MANUFACTURING METHOD THEREOF

(75) Inventors: Jung-hyun Lee, Yongin-si (KR); Kyu-sik Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 156 days.

(21) Appl. No.: 12/662,101

(22) Filed: Mar. 31, 2010

(65) Prior Publication Data

US 2010/0190291 A1    Jul. 29, 2010

Related U.S. Application Data

(62) Division of application No. 11/364,182, filed on Mar. 1, 2006, now Pat. No. 7,732,799.

(30) Foreign Application Priority Data

Mar. 16, 2005    (KR) .................. 10-2005-0021844

(51) Int. Cl.
    *H01L 29/06*    (2006.01)
(52) U.S. Cl.
    USPC .... 257/5; 257/3; 257/4; 257/40; 257/E51.001
(58) Field of Classification Search
    USPC .................. 257/3, 4, 5, 40, E51.001; 438/99
    See application file for complete search history.

(56) References Cited

U.S. PATENT DOCUMENTS

| | | | |
|---|---|---|---|
| 6,487,106 B1 | 11/2002 | Kozicki | |
| 6,567,296 B1 | 5/2003 | Casagrande et al. | |
| 6,667,900 B2 | 12/2003 | Lowrey et al. | |
| 6,674,115 B2 * | 1/2004 | Hudgens et al. | 257/310 |
| 6,825,489 B2 | 11/2004 | Kozicki | |
| 6,855,975 B2 * | 2/2005 | Gilton | 257/296 |
| 6,864,521 B2 * | 3/2005 | Moore et al. | 257/296 |
| 6,888,155 B2 * | 5/2005 | Campbell | 257/2 |
| 6,985,378 B2 * | 1/2006 | Kozicki | 365/153 |
| 7,050,327 B2 * | 5/2006 | Campbell | 365/159 |
| 7,332,735 B2 * | 2/2008 | Campbell | 257/5 |

(Continued)

FOREIGN PATENT DOCUMENTS

KR    10-2004-0035734    4/2004

OTHER PUBLICATIONS

Office Action dated Aug. 4, 2008 for parent U.S. Appl. No. 11/364,182.

Office Action dated Nov. 19, 2008 for parent U.S. Appl. No. 11/364,182.

(Continued)

*Primary Examiner* — Anthony Ho
(74) *Attorney, Agent, or Firm* — Harness, Dickey & Pierce, P.L.C.

(57) ABSTRACT

The semiconductor memory device includes a variable resistance device having a solid electrolyte in a three-dimensional structure. The variable resistance device includes a first electrode; the solid electrolyte, which has at least two regions with different heights, formed on the first electrode; and a second electrode made of a conductive material formed on the solid electrolyte to cover the regions with different heights. In addition, a multibit semiconductor memory device is provided which includes a bias circuit that can control the intensity of a current and time the current is supplied to the variable resistance device inside a memory cell in multiple steps to configure multibits.

9 Claims, 5 Drawing Sheets

(56) References Cited

U.S. PATENT DOCUMENTS

2003/0146427 A1    8/2003    Campbell
2004/0043245 A1*   3/2004    Moore et al. .................. 428/644
2004/0076868 A1*   4/2004    Mardilovich et al. ........... 429/34
2004/0211957 A1   10/2004   Moore et al.
2005/0270820 A1*  12/2005   Mobley et al. ................ 365/100
2006/0109708 A1*   5/2006    Pinnow et al. ................ 365/163
2006/0164880 A1*   7/2006    Sakamoto et al. ............ 365/153

OTHER PUBLICATIONS

Office Action dated Aug. 4, 2009 for parent U.S. Appl. No. 11/364,182.
Notice of Allowance dated Feb. 5, 2010 for parent U.S. Appl. No. 11/364,182.
Official Action issued by the Korean Intellectual Property Office on Oct. 26, 2006, in priority Korean Application No. 10-2005-0021844, and English Abstract thereof.

* cited by examiner

SEMICONDUCTOR MEMORY DEVICE WITH THREE DIMENSIONAL SOLID ELECTROLYTE STRUCTURE, AND MANUFACTURING METHOD THEREOF

This application is a divisional of U.S. application Ser. No. 11/364,182, filed Mar. 1, 2006 now U.S. Pat. No. 7,732,799, which claims priority to Korean Patent Application No. 10-2005-0021844, filed on Mar. 16, 2005 in the Korean Intellectual Property Office, the disclosure of each of which is incorporated herein in its entirety by reference.

BACKGROUND OF THE INVENTION

1. Field of the Disclosure

The present disclosure relates to a semiconductor memory device, and more particularly, to a semiconductor memory device capable of storing multi-bit information by including a variable resistance device with a solid electrolyte in a 3D structure in a storage node.

2. Description of the Related Art

Generally, variable resistance devices are devices in which a resistance changes according to conditions. In a conventional phase-change random access memory (PRAM), which is one type of a nonvolatile memory, a variable resistance device with a phase change material such as GST (Ge—Sb—Te), which has a resistance that varies according to a phase change caused by a change in temperature, is used.

In the PRAM, the phase change material of the variable resistance device crystallizes due to Joule heating or becomes amorphous, thereby changing the resistance of the variable resistance device to store the information. However, generally, a high temperature of 900° C. or greater is required to change the phase of the phase change material. Thus, much heat is generated in storing or erasing information.

U.S. Pat. No. 6,487,106 discloses a memory device with a programmable microelectronic device. FIG. 1 is a cross-sectional view of the programmable microelectronic structure. The variable resistance structure includes a substrate 110, and a first electrode 130 formed on the top of the substrate 110. An insulating material layer 150 with a through-hole formed therein is disposed on the top of the substrate 110. A solid electrolyte 140 and a second electrode 120 are sequentially formed in the through-hole.

When a voltage higher than a predetermined threshold voltage is applied across the first and second electrodes 120 and 130, metal ions of the solid electrolyte migrate and form an electrodeposit. As the electrodeposit forms, various electrical properties change such as the resistance between the first and second electrodes 120 and 130. Information is stored in the variable resistance structure by considering such changes as the resistance between the first and second electrodes 120 and 130.

However, the variable resistance structure illustrated in FIG. 1 cannot be miniaturized to a size presently required. FIGS. 2A and 2B are views of a method of forming the programmable microelectronic structure illustrated in FIG. 1. The problem with the variable resistance structure will be described in detail by explaining the method of forming the variable resistance structure.

First, as illustrated in FIG. 2A, the first electrode 130, a solid electrolyte layer 140', and a second electrode layer 120' are sequentially formed on the substrate 110. Then, as illustrated in FIG. 2B, needless portions of the solid electrolyte layer 140' and the second electrode layer 120' are removed through a photo masking process to form a solid electrolyte layer 140" in a block shape and the second electrode 120. The insulating material layer 150 is formed on the portion where the solid electrolyte layer 140' and the second electrode layer 120' are removed and surrounds the solid electrolyte layer 140" and the second electrode 120.

In this case, in the process of etching and removing the needless portions, the second electrode 120 is undercut. That is, the circumference of the solid electrolyte block is over-etched up to a distance "d" shown in FIG. 2B. To increase the integration of a semiconductor device, the width D of the variable resistance device must be as small as tens of nanometers. Since a typical solid electrolyte and an etchant have over-etched widths of about 10 nm or greater, it is difficult to manufacture the variable resistance structure in the size desired by the market. In addition, the possibility of damage to the sides of the stacked structure during an etching process increases. In more detail, the sides of the components become nonuniform, and thus it is difficult to obtain desirable electrical properties. Therefore, in order to obtain a highly dense memory device, a variable resistance device with a new structure that can be miniaturized to a nanoscale is required.

SUMMARY OF THE DISCLOSURE

The present disclosure provides a variable resistance device with a three-dimensional solid electrolyte structure, and a semiconductor memory device capable of being highly integrated through the usage of the variable resistance device.

The present disclosure also provides a memory cell in which multibits can be stored using electrical characteristics of the variable resistance device with the three-dimensional solid electrolyte structure, and a multibit semiconductor memory device including the memory cell.

The present disclosure also provides manufacturing methods of the variable resistance device and the memory cell.

According to an aspect of the present invention, there is provided a variable resistance device for a semiconductor memory, including: a first electrode made of a conductive material; a solid electrolyte having at least two regions with different heights formed in a three-dimensional structure on the first electrode; and a second electrode made of a conductive material formed on the solid electrolyte to cover the regions with different heights.

The solid electrolyte is a material in which a conductive metal or a metallic ion is uniformly distributed, and electricity is conducted by migration of the metal ions in an electric field. The solid electrolyte may include a first metal material that is to be ionized and a second metal material which can be included as a solid solution.

The first electrode may be formed on the substrate to provide a planarized upper surface, and the second electrode may be formed on the solid electrolyte and fill the region with a low height to provide a planarized upper surface The semiconductor memory cell using variable resistance device may include: a variable resistance device, one end of which is connected to a bit line; and a transistor having a drain connected to the other end of the variable resistance device, a source to which a reference voltage is applied, and a gate connected to a word line. The memory cell according to the present disclosure can be biased using, for example, a select transistor or a diode transistor.

Also, the semiconductor memory cell using the variable resistance device may include: a variable resistance device, one end of which is connected to a bit line; and a diode transistor having an anode connected to the other end of the variable resistance device and a cathode connected to a word line.

In addition, the semiconductor memory cell using the variable resistance device may include: a memory cell array comprising a plurality of bit lines and a plurality of word lines arranged in a matrix, and a plurality of memory cells, one end of which is connected to a corresponding bit line among the plurality of bit lines and the other end of which is connected to a corresponding word line among the plurality of word lines; and a bias circuit which biases at least one of the word lines selected from the plurality of word lines with a predetermined voltage level for a predetermined period of time.

A multibit semiconductor memory device using electric properties of the variable resistance device having a solid electrolyte having at least two regions with different heights may be provided. The exemplary multibit semiconductor memory device includes a bias circuit which supplies current at one of at least two different levels to a selected memory cell. The bias circuit may supply a current for one of the at least two different periods of time or may supply a current at one of the at least two levels for a predetermined period of time.

According to another aspect of the present invention, there is provided a manufacturing method of a variable resistance device. The exemplary method includes: forming an insulating layer on a substrate and then forming a through-hole in the insulating layer to expose a predetermined portion of the top surface of the substrate; forming a flat first electrode composed of a conductive material at the base of the through-hole; forming a solid electrolyte layer to a predetermined thickness along the outline of the through-hole using an atomic layer deposition (ALD) method so that a region with a low height is formed at the center of the solid electrolyte; forming a second electrode composed of a conductive material filling the region with the low height of the solid electrolyte so that the top surface of the surface of the resultant structure is planar; and removing part of the solid electrolyte and second electrode outside of the through-hole.

According to another aspect of the present invention, there is provided a manufacturing method of a semiconductor cell. The exemplary method includes: providing a substrate with word lines and transistors formed thereon; forming a variable resistance device so that drains of the transistors and a first electrode of the variable resistance device contact each other; and forming bit lines perpendicular to the word line such that the bit lines contact the second electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Figure 1:
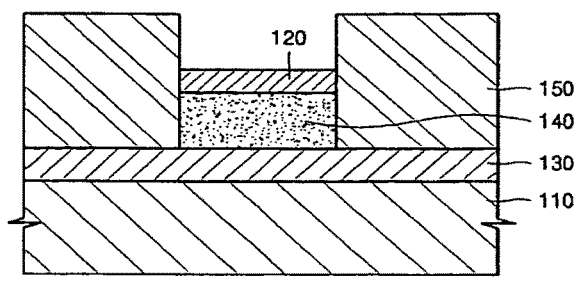
FIG. 1 is a cross-sectional view of a programmable microelectronic structure disclosed in U.S. Pat. No. 6,487,106.
Figure 2A:
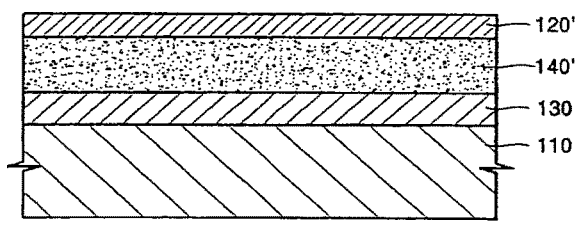
FIGS. 2A and 2B are cross-sectional views illustrating a method of forming the programmable microelectronic structure illustrated in FIG. 1.
Figure 2B:
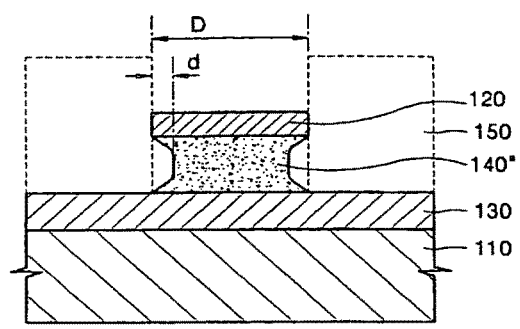

The present invention will now be described more fully with reference to the accompanying drawings, in which exemplary embodiments of the invention are shown. Like reference numerals in the drawings denote like elements.

Figure 3:
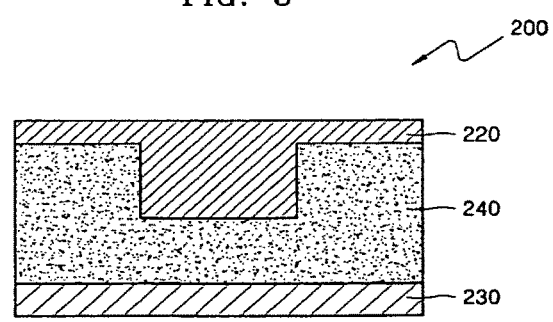
FIG. 3 is a cross-sectional view of a variable resistance device according to an embodiment of the present invention.

FIG. 3 is a cross-sectional view of a variable resistance device 200 according to an embodiment of the present invention. The variable resistance device 200, which can be used in a semiconductor memory, includes a first electrode 230, a second electrode 220, and a three-dimensional solid electrolyte 240 interposed between the first and second electrodes 230 and 220. The first and second electrodes 230 and 220 are made of conductive materials such as metal, and the solid electrolyte 240 has two regions. The height of the solid electrolyte 240 is the distance between the first and second electrodes 230 and 220 filled with the solid electrolyte 240.

The variable resistance device 200 may be shaped in a block, and a region of the solid electrolyte 240 that is lower than the rest of the solid electrolyte 240 may be disposed at the center of the block shape.

The solid electrolyte 240 is an ionic bonding material including a first metal and an anion, and can be categorized into an oxygen family, a sulfur family, a selenium family, and a tellurium family depending on the type of anion. The first metal may be any of a majority of metals that form ionic bonds with anions. For example, the solid electrolyte may be XO, XS, GeTeX, or SbSeX (X=Cu, Ag, Zn, etc.).

The solid electrolyte 240 can further include a second metal which can be added to the first metal as a solid solution. The second metal can be ionized inside the solid electrolyte 240 and act as a charged material. The amount of the second metal included in the solid electrolyte may be lower than a percolation limit of the ionic bonding material of the first metal and the anion. When the amount of the second metal included in the solid electrolyte is greater than the percolation limit, the second metal can cause an irreversible change to an electrical stimulus, and thus becomes unsuitable for use in a semiconductor memory.

The basic principal of the change in the resistance of the variable resistance device 200 is disclosed in U.S. Pat. No. 6,487,106. That is, when a bias voltage is applied across the first and second electrodes 230 and 220 for a predetermined period of time, an electrodeposit forms inside the solid electrolyte 240, thus lowering the resistances of the first and second electrodes 230 and 220. The thickness of the electrodeposit is roughly proportional to the charge supplied to the variable resistance device 200, and $Q=I \cdot \Delta t$ where I is the current and $\Delta t$ is a period of time the current is supplied. Therefore, by controlling the current supplied to the variable resistance device 200 or the amount of time the current is supped, the resistance can be varied.

However, the variable resistance device 200 includes the solid electrolyte 240 having a three-dimensional structure with at least two regions with different heights and the second electrode 220 formed on the solid electrolyte 240 unlike the conventional variable resistance structure illustrated in FIG. 1. Such structural differences result in distinguishable electrical characteristics of the variable resistance device 200 and the conventional variable resistance structure as described below.

When the variable resistance device 200 includes two regions with different heights as illustrated in FIG. 3, an electric field is formed between the first and second electrodes 230 and 220, that is, inside the solid electrolyte 240, when a bias voltage is applied between the first and second electrodes 230 and 220. A stronger electric field is formed in a first region where the height of the solid electrolyte 240 is lower and thus the distance between the first and second electrodes 230 and 200 is shorter. Conversely, a weaker electric field is formed in a second region where the height of the solid electrolyte 240 is greater. Therefore, the migration distance of the ions in the first and second regions differs as well as the migration speed.

As a result of such structural characteristics, the relationship between the current supplied to the variable resistance device 200 and the change in the amount of an electric charge are not proportional to each other. Instead, the resistance of the variable resistance device 200 drastically increases when the amount of electrolyte is greater than a predetermined value. Such electrical characteristics of the variable resistance device 200 are useful for configuring a multibit semiconductor memory. That is, by biasing after dividing the strength of the current supplied to a bias circuit or the time that current is supplied to the bias circuit into at least two levels, at least three bits of distinguishable information can be stored. The number of sections at which the resistances show a drastic change can be varied depending on the number of regions of the solid electrolyte 240 with different heights.

Figure 4:
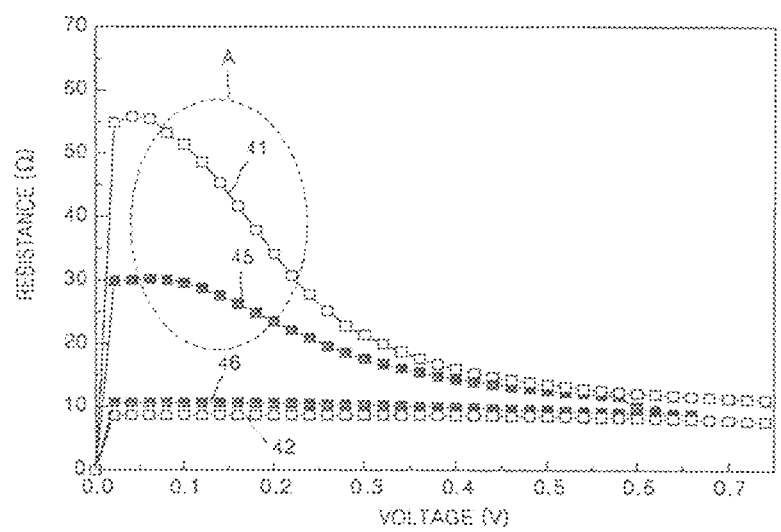
FIG. 4 is a graph illustrating the resistance of a variable resistance device according to an embodiment of the present invention.

FIG. 4 is a graph illustrating the resistance of a variable resistance device when two currents are supplied to the variable resistance device according to an embodiment of the present invention. FIG. 4 illustrates the results of evaluating electrical characteristics of the variable resistance device having a stacked structure composed of GeSeCu (solid electrolyte)/Cu (charged material). The electric characteristics were evaluated by changing the time that the current is supplied at a measured voltage while fixing the current at 0.01 mA. First, in a region A indicated in a dotted line in FIG. 4, a line 41 illustrated by □ indicates the resistance when the current is supplied for a period of 250 ns, and a line 45 illustrated by ■ indicates a resistance when the current is supplied for a period of 500 ns. As can be determined by comparing the lines 41 and 45, the resistance is higher when the current is supplied for a shorter time due to the difference in the migration distance of the electrons. In other words, a small current path through which the electrons can migrate is generated. Lines 42 and 46 at the bottom of the graph indicate the resistance after the current path is generated, and it can be seen that Ohm's law applies since the resistance does not depend on the voltage.

Figure 5:
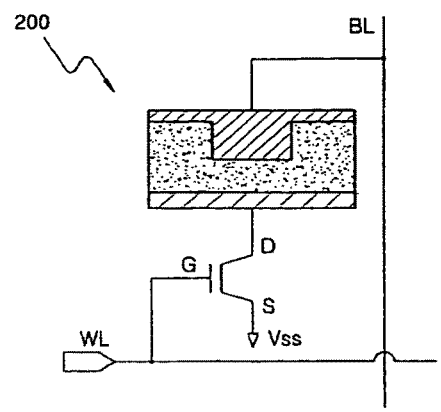
FIG. 5 is a schematic view of a memory cell according to an embodiment of the present invention.

FIG. 5 is a schematic view of a memory cell according to an embodiment of the present invention. The memory cell includes the variable resistance device 200 illustrated in FIG. 3 and a transistor. One end of the variable resistance device 200 is connected to a bit line BL, and the other end of the variable resistance device 200 is connected to a drain D of the transistor. The transistor may be a selection transistor, and a source S of the selection transistor is connected to a reference voltage Vss and a gate G of the selection transistor is connected to a word line WL.

Figure 6:
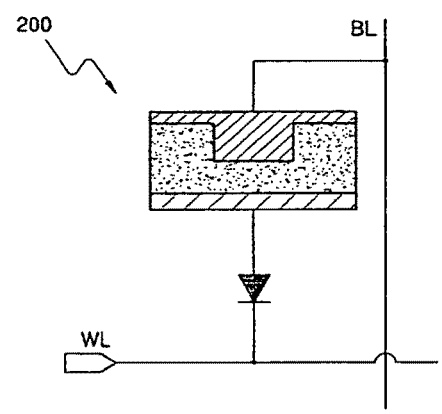
FIG. 6 is a schematic view of a memory cell according to another embodiment of the present invention.

FIG. 6 is a schematic view of a memory cell according to another embodiment of the present invention. The memory cell includes the variable resistance device 200 illustrated in FIG. 3 and a diode transistor. One end of the variable resistance device 200 is connected to a bit line BL, and the other end of the variable resistance device 200 is connected to an anode of the diode transistor. A cathode of the diode transistor is connected to a word line WL.

The bit line BL illustrated in each of FIGS. 5 and 6 is one of a plurality of bit lines, and the word line WL illustrated in each of FIGS. 5 and 6 is one of a plurality of word lines. The bit lines and the word lines may be formed in a plurality of strips perpendicularly crossing each other, and memory cells may be disposed at each of the corresponding crossing points. A memory cell array with the memory cells arranged in a lattice pattern is well known to those skilled in the related art to which the present invention pertains. Furthermore, a memory cell array including a plurality of unit cells is disclosed in U.S. Pat. Nos. 6,667,900 and 6,567,296.

The semiconductor memory device described above includes a bias circuit which biases a memory cell array comprising memory cells having the variable resistance device 200 arranged in a matrix structure and at least one word line selected from a plurality of word lines in the matrix structure for a predetermined period of time at a predetermined level. That is, a memory cell is addressed by the selection of one of the bit lines and one of the word lines, and information can be stored by supplying a predetermined current to the variable resistance device 200 for a predetermined period of time. The stored information can be read by measuring a resistance by applying a voltage lower than the voltage used to store the information to the variable resistance device 200.

A multibit semiconductor memory device includes the memory cell array described above and a bias circuit capable of multi-level biasing. The bias circuit may supply at least two different levels of charges to the variable resistance device of the selected memory cell. In more detail, the bias circuit of the multibit semiconductor memory device either supplies current at a predetermined level for one of at least two different periods of time or supplies current at one of at least two levels for a predetermined period of time.

Figure 7A:
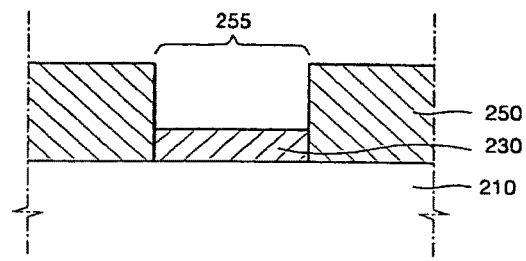
FIGS. 7A through 7C are sectional views illustrating a manufacturing method of a variable resistance device according to an embodiment of the present invention.
Figure 7B:
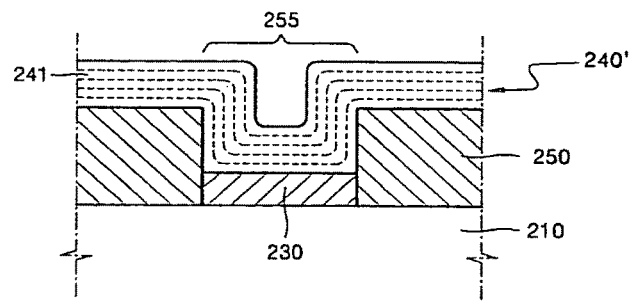
Figure 7C:
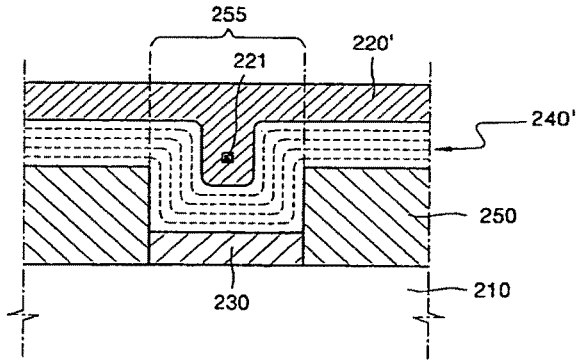

A manufacturing method of a variable resistance device having a solid electrolyte in a three-dimensional structure and a manufacturing method of the semiconductor memory cell will be described below. Although the manufacturing method described below is for a single device or a unit cell, manufacturing of the semiconductor memory device can be expanded by repeating each of the operations of the manufacturing method, which is well known to those skilled in the art to which the present invention pertains. FIGS. 7A through 7C are views illustrating a manufacturing method of a variable resistance device according to an embodiment of the present invention.

First, as illustrated in FIG. 7A, an insulating layer 250 is formed on a substrate 210, and a through-hole 255 which passes through the insulating layer 250 is formed at a predetermined location in the insulating layer 250. The through-hole 255 may have a square or a circular cross-section. However, the diameter or width of the through-hole 255 may be greater than the thickness of the insulating layer 250, that is, the height of the through-hole 255. The width or the diameter of the through-hole 255 may be several to tens of nanometers. A first electrode 230 formed of a conductive material is formed at the bottom of the through-hole 255.

The insulating layer 250 may be made of $SiO_2$, the through-hole 255 may be formed through a typical photo-masking process, and the first electrode 230 may be formed through sputtering, chemical vapor deposition (CVD), or atomic layer deposition (ALD). The first electrode 230 and a second electrode 220 described below can be made of various metals with excellent conductivity, such as Ag or Cu.

In addition, a thin-film transistor or a diode may be formed on the substrate 210 before the insulating layer 250 is formed. In this case, the through-hole 255 may be formed at a drain of the transistor or an anode of the diode, and a gate of the transistor or a cathode of the diode is connected to one of a plurality of word lines arranged in strips. The word line may be formed within a doped silicon pattern.

Next, as illustrated in FIG. 7B, a solid electrolyte 240' is formed to a predetermined thickness along the outline of the through-hole 255 through ALD. ALD is a thin-film deposition method in which an atomic layer thin-film is formed repeatedly by performing a cycle including supplying a source gas to a furnace, purging the source gas by supplying a source purge gas, supplying a reaction gas, and purging of the reaction gas by supplying a reaction purge gas to form a thin-film having a desired thickness. For example, when depositing a GST (Ge—Sb—Te) thin-film, Ge, Sb, and Te atomic layers are alternately deposited. An atomic layer of each component is deposited as frequently as required to obtain a desired composition ratio of the component.

As an example, when forming the solid electrolyte 240' with a first metal such as Ag or Cu added in a solid solution on the GST, atomic layers of the first metal are formed as frequently as required between the GST deposition cycles described above to obtain a predetermined composition ratio. As a result, the first metal layer can be uniformly distributed within the solid electrolyte 240'. The first metal is a metal selected from the group consisting of metals that can be included in a solid solution with Te, a second metal, and the composition ratio of the first metal may be smaller than a percolation limit.

In addition to the example described above, other various materials can be used to form the solid electrolyte 240'. Characteristics and types of such materials are the same as those of the variable resistance device according to embodiments of the present invention.

Next, as illustrated in FIG. 7C, a second electrode layer 220' is formed on the solid electrolyte 240' using a conductive material. The second electrode layer 220' is formed in the same way as the first electrode 230, i.e., by sputtering, CVD, or ALD with a metal with excellent conductivity. However, when the width or the diameter of the through-hole 255 is about 50 nm or less, CVD or ALD may be performed. The second electrode layer 220' fills a concaved groove 221 at the center of the solid electrolyte 240' and is formed to a predetermined thickness to have a flat upper surface.

The variable resistance device manufactured according to the present embodiment is completed by removing the structure disposed outside the through-hole 255, that is, outside the dotted lines illustrated in FIG. 7C. As described above, when word lines and transistors or diodes are formed on the substrate 210, the semiconductor memory cell can be formed by forming the bit lines perpendicular to the word lines on the second electrode 220. Here, the bit lines may be formed with a doped silicon pattern.

The present disclosure provides a variable resistance device with a solid electrolyte in a three-dimensional structure capable of being miniaturized to several to tens of nanometer, and a semiconductor memory device including the variable resistance device that can be highly integrated and produces little heat.

In addition, the present disclosure provides a memory cell capable of storing multibits using electrical characteristics of the variable resistance device including the solid electrolyte in a three-dimensional structure, and a multibit semiconductor memory device including the memory cell.

Furthermore, the present disclosure provides manufacturing methods of the variable resistance device and the memory cell.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A manufacturing method of a variable resistance device, comprising:
   forming an insulating layer on a substrate and then forming a through-hole in the insulating layer to expose a portion of a top surface of the substrate;
   forming a flat first electrode composed of a conductive material at a base of the through-hole;
   forming a solid electrolyte layer to a thickness along an outline of the through-hole using atomic layer deposition (ALD) so that a region with a low height is at a center of the solid electrolyte layer;
   forming a second electrode composed of a conductive material filling the region with the low height of the solid electrolyte layer so that a top surface of a resultant structure is planar; and
   removing entire portions of the solid electrolyte layer and the second electrode that are outside of the through-hole, respectively.

2. The manufacturing method of claim 1, wherein the solid electrolyte layer comprises an anion material selected from the group consisting of O, S, Se, and Te, and a first metal which is ionically bonded with the selected anion material.

3. The manufacturing method of claim 2, wherein the solid electrolyte layer further comprises a second metal which can be included as a solid solution with the first metal.

4. The manufacturing method of claim 1, wherein the through-hole has a width greater than its height.

5. The manufacturing method of claim 1, wherein the width of the through-hole is several to tens of nanometers.

6. The method of claim 1, wherein the removing includes removing entire portions of the solid electrolyte layer and the second electrode that are outside of the through-hole, respectively, after forming the second electrode.

7. A manufacturing method of a variable resistance device, comprising:
   forming an insulating layer on a substrate and then forming a through-hole in the insulating layer to expose a portion of a top surface of the substrate;
   forming a flat first electrode composed of a conductive material at a base of the through-hole;
   forming a solid electrolyte layer to a thickness along an outline of the through-hole using atomic layer deposition (ALD) so that a region with a low height is at a center of the solid electrolyte layer;
   forming a second electrode composed of a conductive material filling the region with the low height of the solid electrolyte layer so that a top surface of a resultant structure is planar; and
   removing part of the solid electrolyte layer and the second electrode outside of the through-hole,
   wherein the solid electrolyte layer comprises an anion material selected from the group consisting of O, S, Se, and Te, and a first metal which is ionically bonded with the selected anion material, the solid electrolyte layer further comprises a second metal which can be included as a solid solution with the first metal, and the amount of the second metal in the solid electrolyte layer is within a percolation limit of the solid electrolyte layer.

8. A manufacturing method of a variable resistance device, comprising:
- forming an insulating layer on a substrate and then forming a through-hole in the insulating layer to expose a portion of a top surface of the substrate;
- forming a flat first electrode composed of a conductive material at a base of the through-hole;
- forming a solid electrolyte layer to a thickness along an outline of the through-hole using atomic layer deposition (ALD) so that a region with a low height is at a center of the solid electrolyte layer;
- forming a second electrode composed of a conductive material filling the region with the low height of the solid electrolyte layer so that a top surface of a resultant structure is planar; and
- removing part of the solid electrolyte layer and the second electrode outside of the through-hole,
- wherein the solid electrolyte layer includes components and the forming of the solid electrolyte layer comprises alternately depositing atomic layers of each component of the solid electrolyte layer with a frequency according to a ratio of each component.

9. A manufacturing method of a semiconductor cell, comprising:
- providing a substrate with word lines and transistors formed thereon;
- forming an insulating layer on the substrate, and then forming a through-hole in the insulating layer so that drains of the transistors are exposed by the through-hole;
- forming a flat first electrode composed of a conductive material at a base of the through-hole;
- forming a solid electrolyte layer to a thickness along an outline of the through-hole using atomic layer deposition (ALD) so that a region with a low height is at a center of the solid electrolyte layer;
- forming a second electrode composed of a conductive material filling the region with the low height of the solid electrolyte layer so that a top surface of a resultant structure is planar; and
- removing entire portions of the solid electrolyte layer and the second electrode that are outside of the through-hole, respectively; and
- forming bit lines perpendicular to the word lines such that the bit lines contact the top surface of the second electrode.

* * * * *